United States Patent

Matsuda et al.

[11] Patent Number: 5,918,796
[45] Date of Patent: Jul. 6, 1999

[54] METHOD OF FABRICATING PACKAGE FOR HOUSING SEMICONDUCTOR ELEMENT

[75] Inventors: Shin Matsuda; Shingo Sato, both of Kokubu, Japan

[73] Assignee: Kyocera Corporation, Kyoto, Japan

[21] Appl. No.: 08/800,792

[22] Filed: Feb. 14, 1997

[30] Foreign Application Priority Data

Feb. 23, 1996 [JP] Japan .................................. 8-036724

[51] Int. Cl.$^6$ .................................................. H01L 23/00
[52] U.S. Cl. .................... 228/248.1; 228/254; 427/96; 427/123; 148/24; 148/23; 148/22
[58] Field of Search ............................ 228/248.1, 254; 427/96, 123; 148/24, 23, 22

[56] References Cited

U.S. PATENT DOCUMENTS

| | | | |
|---|---|---|---|
| 3,719,981 | 3/1973 | Steitz | 29/423 |
| 4,830,264 | 5/1989 | Bitaillow et al. | 228/180.2 |
| 4,906,823 | 3/1990 | Kushima et al. | 228/245 |
| 5,133,495 | 7/1992 | Angulas et al. | 228/180.1 |
| 5,203,075 | 4/1993 | Angulas et al. | 29/830 |
| 5,442,852 | 8/1995 | Danner | 29/843 |
| 5,620,129 | 4/1997 | Rogren | 228/56.3 |

*Primary Examiner*—Patrick Ryan
*Assistant Examiner*—M. Alexandra Elve
*Attorney, Agent, or Firm*—Loeb & Loeb LLP

[57] ABSTRACT

A method of fabricating a package for housing a semiconductor element, comprising applying solder paste within plural depressions which are formed on at least one principal surface of an insulating substrate and have electrical connection pads, protruding the surface of the solder paste from the principal surface of the insulating substrate, mounting solder balls on the surface of the solder paste, and fusing the solder paste and the solder balls to produce unitary structures in order to form connection terminals with spherical protrusions.

11 Claims, 5 Drawing Sheets

METHOD OF FABRICATING PACKAGE FOR HOUSING SEMICONDUCTOR ELEMENT

BACKGROUND OF THE INVENTION

1. Field of the Invention

The present invention relates to a method of fabricating a package for housing a semiconductor element.

2. Related Art

In the past, a package for housing a semiconductor element such as LSI (large-scale integrated circuit), which is generally made of electrical insulating materials like alumina ceramic and comprises an insulating substrate having a depression at nearly the center portion on top of the package, a plurality of wiring layers formed of a metal such as tungsten or molybdenum which are led away from the periphery of the depression of the insulating substrate and extending to an underside thereof, a plurality of electrical connection pads which are formed on the underside of the insulating substrate and are electrically connected to the wiring layers, connection ball terminals consisting of solder hard-soldered to the connection pads, and a lid, become a semiconductor device that can be fabricated as a product by securely bonding the semiconductor element within the depression of the insulating substrate using an adhesive consisting of a material such as glass or resin; electrically connecting the respective electrodes of the semiconductor element to the wiring layers by means of bonding wires while joining the lid to the upper surface of the insulating substrate using a sealant such as glass or resin; and hermetically sealing the semiconductor element inside a container consisting of the insulating substrate and the lid.

Such semiconductor devices are mounted on an external electrical circuit board by installing ball connection terminals, which are formed of solder hard-soldered to the electrical connection pads on the underside of the insulating substrate, on the wiring conductors of the external electrical circuit board; thereafter fusing the connection terminals at a temperature of from about 200 to about 300° C. to join the connection terminals to the wire conductors. Simultaneously, the respective electrodes of the semiconductor element housed inside the package for housing a semiconductor element are electrically connected to the external electrical circuit by means of the wiring layers and the connection terminals.

The prior art includes some known methods of connecting such connection ball terminals to wiring boards such as external electric circuits. For example, the method disclosed in U.S. Pat. No. 3,719,981 (issued to Steitz) is designed so that solder balls are joined to low-profile solder bumps forming part of the primary layer on a substrate in order to allow electrical connections to a printed circuit board. A tacky pressure-sensitive tape is used for maintaing an alignment of the solder balls in a row while the solder balls are properly aligned with the solder bumps and reflowed to form connection ball terminals. This method, however, is considered lengthy and involves too many steps. In addition, control over the ultimate size of the reflowed solder balls (that is, the size of the connection ball terminals) is considered to be inadequate.

Another method is disclosed in U.S. Pat. No. 5,203,075 (issued to Angulas, et al.), in which the formation of interconnections between circuit substrates is achieved by fusing solder paste deposits applied to pads on either of the substrates. More specifically, the solder paste melts and balls up around a solder ball attached to a substrate opposite to the substrate with the solder paste applied thereto to form spherical lumps (connection ball terminals). When this method is used, however, some problems occur when the solder balls are attached to the opposite substrate in advance.

When the solder ball is mounted in a depression on the substrate, the solder ball does not greatly protrude from the underside of the substrate in cases where the diameter of the solder balls is smaller than the opening (diameter) of the depressions, and this makes it difficult to connect the solder balls to another circuit substrate. On the other hand, in cases where the diameter of the solder balls is greater than the opening (diameter) of the depressions, the solder balls are brought into contact with the opening of the depressions and prevented from contact with connection pads in the depressions on the counterpart substrate, and as a result, the solder balls cannot be securely connected to the connection pads.

U.S. Pat. No. 5,133,495 (issued to Angulas et al.) discloses yet another method, in which deposits of solder paste surrounded by dewetting material are heated so that the solder paste forms connection ball terminals which are electrically connected to the connection pads beneath the solder deposits. The electrical connections between the substrates are established by connecting the connection ball terminals to the connection pads provided in the depressions on the twinned substrate. According to this method, however, it is difficult to make terminals of a uniform size (particularly, diameter), since the connection ball terminals are formed of only solder paste, without using solder balls. If the sizes of the connection ball terminals are not properly controlled, precisely the same problem occurs as that related with the size correlation between the solder balls and the depressions on the circuit substrate, described above concerning the disclosure of U.S. Pat. No. 5,203,075.

Yet another method is disclosed in U.S. Pat. No. 5,442,852 (issued to Danner), in which solder balls placed in depressions provided on a substrate are fused and connected to connection pads in the depressions to form connection ball terminals together. The connection ball terminals may be used to establish electrical connections between a separate wiring board such as an external electric circuit and the substrate provided with the connection ball terminals.

When this method is followed, however, a variety of problems such as those mentioned above arise, since only solder balls are fused to form connection ball terminals, without using solder paste. More specifically, when the solder balls are mounted in the depressions, the solder balls do not greatly protrude from the underside of the substrate in cases where the diameter of the solder balls is smaller than the opening of the depressions, and this makes it difficult to connect the connection ball terminals to the external electric circuit.

On the other hand, in cases where the diameter of the solder balls is greater than the opening of the depressions, the solder balls are brought into contact with the opening of the depressions and prevented from contact with the connection pads, and as a result, the solder balls cannot be securely connected to the connection pads. In order to solve the problem, a reasonable suggestion is to reduce the depth of the depressions in order to allow the solder balls to be brought into partial contact with the connection pads according to the prior art method. Nevertheless, the following problems are brought about when ceramic such as alumina ceramic is used to form the insulating substrates. Specifically, in those packages for housing semiconductor elements according to the prior art, the coefficient of thermal expansion of the insulating substrate made of alumina ceramic or the like is $6.5 \times 10^{-6}$ or greater, whereas an external electrical circuit board, which is generally made of glass epoxy, has a coefficient of thermal expansion of from $2\times10^{-5}/°C$ to $4\times10^{-5}/°C$. Because there is a large difference between the two coefficients, when the semiconductor element is housed inside the package for housing a semiconductor element to fabricate a semiconductor device which is then mounted on the external electrical circuit board and, heat generated while the semiconductor element is operated is repeatedly applied to both the insulating substrate and the external electrical circuit board, a large thermal stress occurs between the insulating substrate of the package and the external electrical circuit board due to the difference of both coefficients of thermal expansion. This stress acts on the peripheral portion of the connection pads on the underside of the insulating substrate to separate the connection pads from the insulating substrate. A defect which occurs as a result of this is that, over a long period of time, the respective electrodes of the semiconductor element housed inside the package for housing a semiconductor element can not be electrically connected to predetermined external electrical circuits.

SUMMARY OF THE INVENTION

In view of the drawbacks of the prior art described above, it is an object of the present invention to provide a method of fabricating a package for housing a semiconductor element which has an insulating substrate and electrical connection pads securely joined together and which allows accurate electrical connection to be established over a long period of time between each electrode of the semiconductor element housed inside the package and predetermined external electrical circuits.

The present invention provides a method of fabricating a package for housing a semiconductor element, characterized by comprising the steps of:

(a) preparing an insulating substrate which has a plurality of depressions on at least one principal surface thereof, with an electrical connection pad formed in each of the depressions;

(b) applying solder paste containing solder powder within the depressions in order for the surface of the solder paste to protrude from the principal surface of the insulating substrate;

(c) mounting solder balls on the surface of the solder paste; and (d) fusing the solder paste and the solder balls to produce unitary structures in order to form connection terminals with ball protrusions.

In the method of fabricating a package for housing a semiconductor element, the solder balls preferably have substantially the same melting point as does the solder powder. In addition, the solder balls have substantially the same solder composition as does the solder powder.

More preferably, the diameter X of the solder balls satisfies the following equation:

$$a<X\leq0.85b$$

where "a" represents the diameter of the depression on the insulating substrate, and "b" represents the total of the distance between two adjacent depressions and the diameter of the depression.

Preferably, the solder powder is the powder of an alloy of tin as the main ingredient, and at least one metal which is selected from the group consisting of lead, bismuth, silver and copper.

Also, preferably, the viscosity of the solder paste is in a range of from about 150,000 to about 350,000 centipoises.

More preferably, the solder paste is formed of solder powder with an average particle size of about 50 μm or smaller which contains about 8 to about 10% by weight of a flux comprising of a resin, an activating agent and a solvent.

The depression on the insulating substrate preferably has a diameter of from about 0.3 to about 1.0 mm and a depth of about 0.05 mm or greater.

In addition, the solder paste-applied protrusion formed on the principal surface of the insulating substrate preferably has a height in a range of from about 100 to about 200 μm.

More preferably, the insulating substrate is made of an insulating ceramic material which is selected from the group consisting of aluminum oxide sintered body, mullite sintered body, silicon carbide sintered body, aluminum nitride sintered body and glass ceramic sintered body, or made of an insulating organic resin material which is selected from the group consisting of epoxy resin, polyimide resin, phenol resin, polyphenylene ether resin, polyimido-amide resin, bismaleimido-triazine resin and fluorine resin.

In step (c) of the method of fabricating a package for housing a semiconductor element according to the invention, a mask is prepared which is preferably provided with a plurality of through-holes aligned with the plurality of depressions on the insulating substrate, and is placed with a distance from the surface of the solder paste in order for the through-holes to face the corresponding depressions, and the solder balls are mounted on the surface of the solder paste via the through-holes of the mask.

BRIEF EXPLANATION OF THE DRAWINGS

The above objects, as well as further objects, features and advantages of the present invention, will be more fully understood by reference to the following detailed description and the accompanying drawings.

DETAILED DESCRIPTION OF THE INVENTION

The invention will be described in detail by way of examples with reference to the accompanying drawings.

Figure 1:
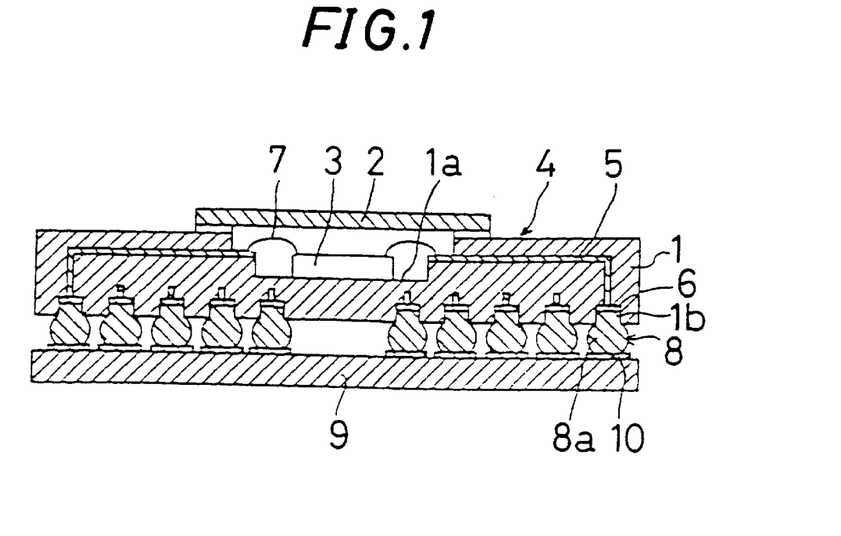
FIG. 1 is a cross-sectional view illustrative of a semiconductor device comprising a package for housing a semiconductor element which is fabricated according to an embodiment of the fabricating method of the present invention.
Figure 2:
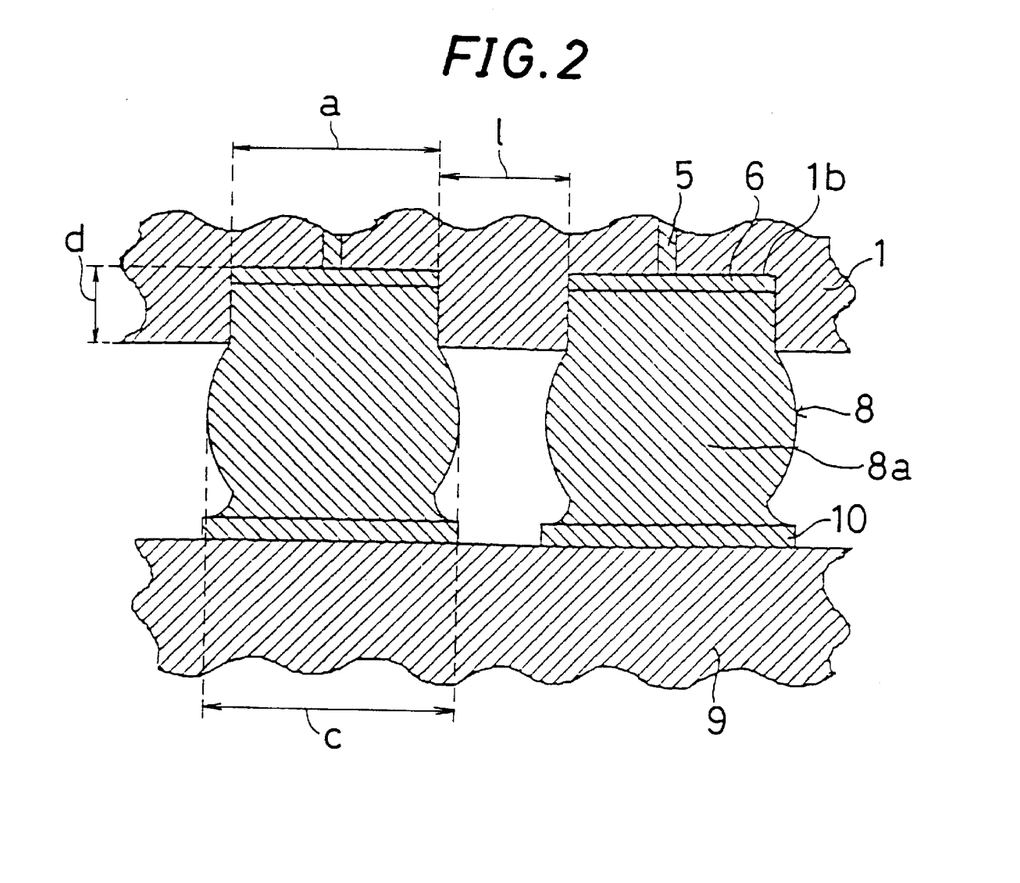
FIG. 2 is a principal expanded cross-sectional view of the semiconductor device illustrated in FIG. 1.

FIG. 1 and FIG. 2 illustrate a semiconductor device comprising a package for housing a semiconductor element which is fabricated according to an embodiment of the present invention, where 1 indicates an insulating substrate and 2 indicates a lid. The insulating substrate 1 and the lid 2 construct a package 4 which houses a semiconductor element 3.

The insulating substrate, made of an insulating ceramic material such as aluminum oxide sintered body, mullite sintered body, silicon carbide sintered body, aluminum nitride sintered body or glass ceramic sintered body, or made of an insulating organic resin material such as epoxy resin, polyimide resin, phenol resin, polyphenylene ether resin, polyimido-amide resin, bismaleimido-triazine resin and fluorine resin, has a hollow part 1a in the center on top of the upper surface thereof in order to house the semiconductor element 3, with the semiconductor element 3 firmly bonded to the inside of the hollow part 1a by means of an adhesive such as resin.

A plurality of coating, wiring layers 5 comprising a metal such as tungsten, molybdenum, copper, silver or gold extends from the periphery of the hollow part 1a for housing the semiconductor element 3 to the underside of the insulating substrate 1, and a plurality of depressions 1b are formed on the underside of the insulating substrate 1, with a spacing (l) of 0.45–0.75 mm, as illustrated in FIG. 2. Formed by coating inside the respective depressions 1b are connection pads 6 comprising a metal such as tungsten, molybdenum, copper, silver or gold to which the wiring layers 5 are electrically connected.

The wiring layers 5 connect the respective electrodes of the semiconductor element 3 to the electrical connection pads 6 formed inside the depressions 1b provided on the underside of the insulating substrate 1, the electrodes of the semiconductor element 3 are connected, by means of wiring bonds 7, to the periphery of the wiring layers 5 at the side of the hollow part 1a in which the semiconductor element 3 is mounted, and the region led away from the underside of the insulating substrate 1 is electrically connected to the electrical connection pads 6 formed inside the depressions 1b on the underside of the insulating substrate 1.

The electrical connection pads 6 with the connection terminals 8 hard-soldered to the surfaces thereof, are electrically connected to the wiring layers 5 and serve as an underlying metal layer when the connection terminals 8 are attached to the insulating substrate 1, as will be explained later.

The connection terminals 8 hard-soldered to the electrical connection pads 6 mount the insulating substrate 1 on an external electrical circuit board 9, connect the respective electrodes of the semiconductor element 3 housed inside, and are joined to the wiring conductors 10 of the external electrical circuit board 9 by fusing the connection terminals 8 placed on the wiring conductors 10 of the external electrical circuit board 9 at a temperature of from about 200 to about 300° C.

The connection terminals 8 are formed of the regions inside the depressions 1b and spherical protrusions 8a with a diameter (c) larger than the diameter (a) of the depressions 1b which protrude from the underside of the insulating substrate 1. The ball connection terminals 8 are formed of the two regions, the regions inside the depressions 1b and the protrusions 8a protruding from the underside of the insulating substrate 1, in order to effectively prevent a large thermal stress which may occur due to the difference in coefficients of thermal expansion between the insulating substrate 1 and the external electrical circuit board 9 to which heat is applied after the insulating substrate 1 has been mounted on the external electrical circuit board 9 by means of the connection terminals 8, from being directly placed on the electrical connection pads 6 by partially dissipating the thermal stress in the regions near the opening of the depressions 1b, thus allowing the electrical connection pads 6 to be joined to the insulating substrate 1 with a very high degree of reliability.

Here, if the depth (d) of the depressions 1b is less than about 0.05 mm, the thermal stress is only slightly dissipated in the regions near the opening of the depressions 1b, and thus a large thermal stress is directly placed on the electrical connection pads 6 to impair the reliability of the junction between the electrical connection pads 6 and the insulating substrate 1. Therefore, the depth (d) of the depressions 1b is desirable to be about 0.05 mm or more. On the other hand, if the diameter (a) of the depressions 1b is less than about 0.3 mm, the regions of the electrical connection pads 6 which are formed inside are narrow, and this makes it difficult to securely hard-solder the connection terminals 8 to the electrical connection pads 6, whereas it is easy for a contact short-circuit to occur between the spherical protrusions 8a of the neighboring connection terminals 8 when the diameter exceeds about 1.0 mm. Consequently, the diameter (a) of the depressions 1b preferably is within a range from about 0.3 mm to about 1.0 mm.

When the diameter (c) of the protrusions 8a of the connection terminals 8 is less than about 0.35 mm, the quantity of the protrusions 8 which protrude from the underside of the insulating substrate 1 is reduced, and this may reduce the reliability of the junction between the electrical connection pads 6 of the insulating substrate 1 and the wiring conductors 10 on the external electrical circuit substrate 9 by means of the connection terminals 8. In order to prevent this, the diameter (c) of the protrusions 8a of the connection terminals 8 are preferred to be about 0.35 mm or greater.

The package for housing a semiconductor element according to the invention then becomes a semiconductor device that can be fabricated as a product by securely placing the semiconductor element 3 in the hollow part 1a of the insulating base 1 using an adhesive such as glass or resin and concurrently electrically connecting the respective electrodes of the semiconductor element 3 to the wiring layers 5 by means of the bonding wires 7, then joining the lid 2 to the upper surface of the insulating base 1 using a sealant such as glass or resin, and then hermetically sealing the semi-conductor element 3 inside the package 4 consisting of the insulating base I and the lid 2.

Such a semiconductor device is finally finished as a practical semiconductor device by mounting the connection terminals 8 on the underside of the insulating substrate 1 on the wiring conductors 10 of the external electrical circuit board 9, and fusing (reflowing) the connection terminals 8 at a temperature of from about 200 to about 300° C. to join the connection terminals 8 to the wiring conductors 10, thereby allowing the connection terminals 8 to be mounted on the external electrical circuit board 9 and establishing electrical connections between the respective electrodes of the semiconductor element 3 housed inside and the corresponding wiring conductors 10.

A method of fabricating the package for housing a semiconductor element will now be described on a step basis with reference to FIG. 3 through FIG. 6.

Figure 3:
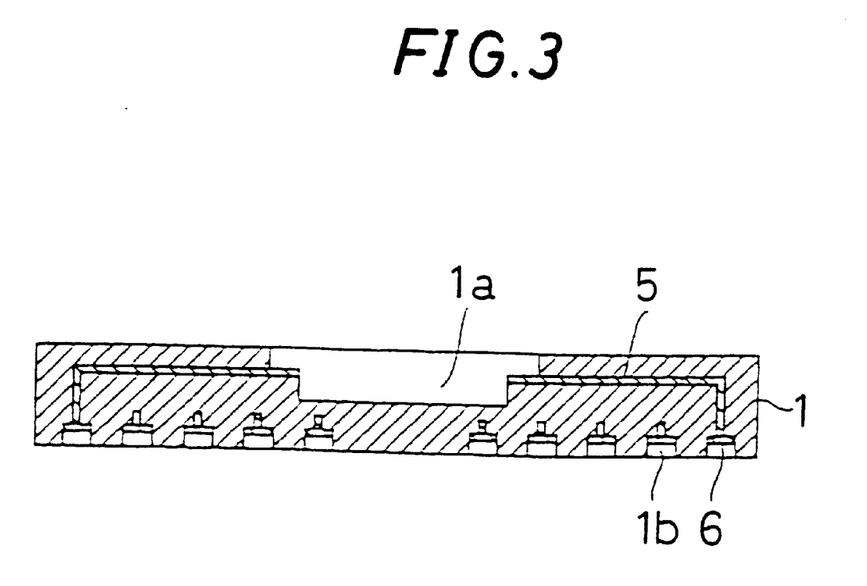
FIG. 3 is a cross-sectional view illustrative of the first step of the method of fabricating a package for housing a semiconductor element according to the invention.

As illustrated in FIG. 3, in the first step, an insulating substrate 1 is prepared which has, on the upper surface thereof, a hollow part 1a for mounting a semiconductor element and on the underside thereof, a plurality of depressions 1b and is provided with a plurality of wiring layers 5 which are led away from the periphery of the hollow part 1a and electrical connection pads 6 which are formed in the depressions 1b to establish electrical connections between the wiring layers 5 and the electrical connection pads 6.

As described above, the insulating substrate is made of an insulating ceramic material such as aluminum oxide sintered body, mullite sintered body, silicon carbide sintered body, aluminum nitride sintered body or glass ceramic sintered body, or made of an insulating organic resin material such as epoxy resin, polyimide resin, phenol resin, polyphenylene ether resin, polyimido-amide resin, bismaleimido-triazine resin or fluorine resin. When the insulating substrate 1 is composed of aluminum oxide sintered body, for example, an appropriate organic binder, plasticizer and solvent are added to and mixed with the powder of a ceramic material such as aluminum oxide, silicon oxide, magnesium oxide or calcium oxide to prepare a sludge which is then processed into green sheets (raw sheets) by the well-known doctor blade method or the calender roll method of the prior art, and the green sheets are appropriately punched, laminated and then fired at a temperature of about 1600° C. When the insulating substrate 1 is composed of epoxy resin, a curing agent such as an amine-based curing agent, imidazole-based curing agent or acid anhydride-based curing agent is added to bisphenol A-type epoxy resin, novolac-type epoxy resin or glycidyl ester-type epoxy resin or the like to prepare a pasty epoxy resin precursor which is then formed into sheets and thermally treated to be semi-cured to green sheets which are in turn laminated and thermally treated at a temperature of about 80 to about 200° C. for about 0.5 to about 3 hours to complete the thermal curing.

The hollow part 1a which is provided on the upper surface of the insulating substrate 1 for mounting a semiconductor element and the plural depressions 1b which are provided on the underside thereof are formed in prescribed forms at prescribed positions on the insulating substrate 1 by previously punching the respective green sheets.

Furthermore, the wiring layers 5 and the electrical connection pads 6, which are composed of a metal such as tungsten, molybdenum, copper, silver or gold, are formed by printing a predetermined pattern of metal paste prepared by mixing the powder of the metal with an appropriate organic binder, plasticizer and solvent added thereto, on the respective green sheets by the well-known screen printing method of the prior art; the green sheets are processed into the insulating substrate 1 in this way, the wiring layers 5 extend from the periphery of the hollow part 1a of the insulating substrate 1 for mounting a semiconductor element, to the depressions 1b formed on the underside of the insulating substrate 1, while the electrical connection pads 6 are formed inside the depressions 1b formed on the underside of the insulating substrate 1.

Figure 4A:
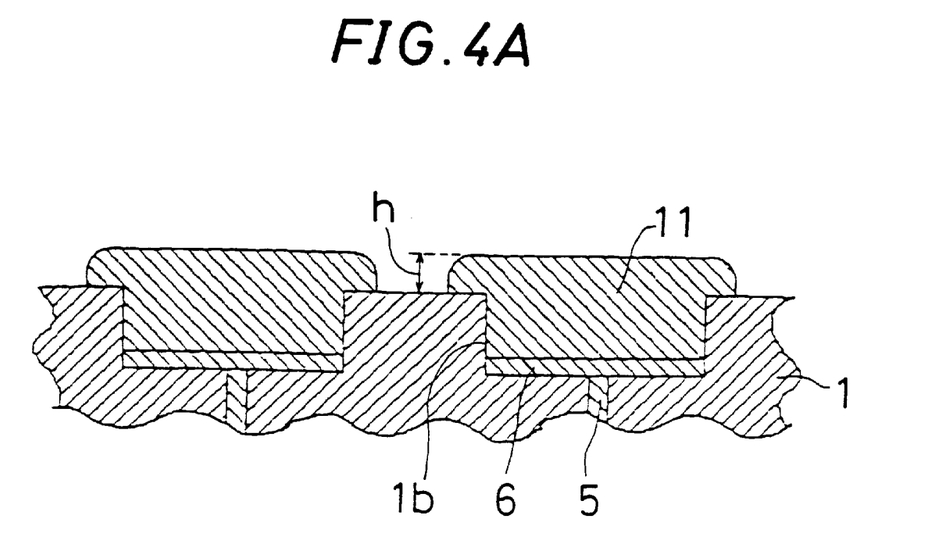
FIG. 4A and FIG. 4B are cross-sectional views illustrative of the second step of the method of fabricating a package for housing a semiconductor element according to the invention.

Thereafter, as illustrated in FIG. 4A, in the second step, solder paste 11 is applied inside the depressions 1b of the insulating substrate 1, and the surface of the solder paste 11 is protruded from the underside of the insulating substrate 1.

Figure 4B:
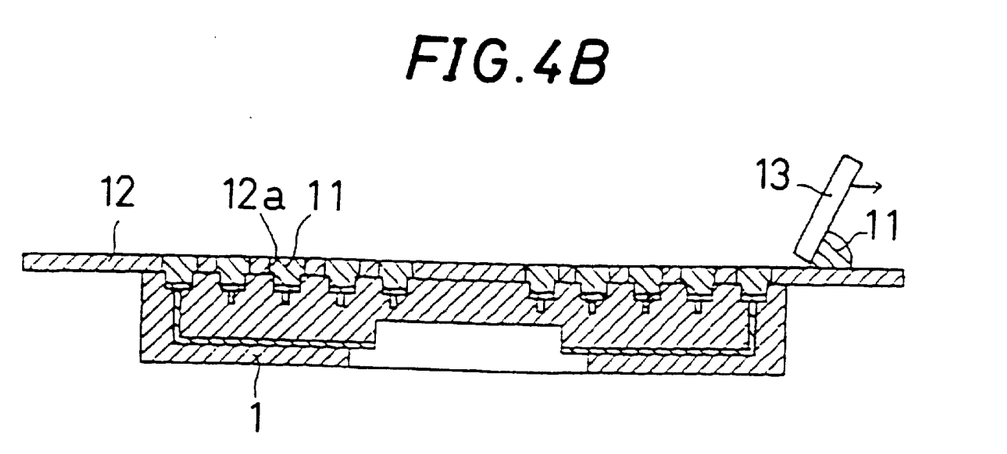

The application of the solder paste to the inside of the depressions 1b of the insulating substrate 1 is carried out by the well-known screen printing method of the prior art. For example, as illustrated in FIG. 4B, the insulating substrate 1 is turned upside down, and a masking stainless plate 12 which has holes 12a with a diameter slightly (about 150 $\mu$m) larger than the diameter (a) of the depressions 1b at positions corresponding to the depressions 1b of the insulating substrate 1 and is from about 100 to about 200 $\mu$m in thickness is placed on the underside (upper surface in the drawing) of the insulating substrate 1, the solder paste 11 is applied to the upper surface of the masking stainless plate 12, and a squeegee is run on the solder paste 11 to squeeze part of the solder paste 11 into the depressions 1b of the insulating substrate 1 through the holes 12a.

Available for use as the solder paste 11 includes one which has a viscosity on the order of 150,000–350,000 centi-poises (measured with spiral-type rotational viscometer PCU-2a manufactured by Malcohm, Inc., rotor speed: 10 ppm), and is prepared by adding, to a solder powder with a particle size of about 50 $\mu$m or less, about 8 to about 10% by weight of a flux which is prepared by mixing a rosin-based resin, an activating agent comprising a salt of an amine and a hydrogen halide such as dimethylamine hydrochloride or diethylamine hydrochloride, an vegetable-source organic acid such as citric acid or succinic acid, and a solvent comprising an alcohol such as isopropyl alcohol or ethyl alcohol. Available for use as the solder paste includes one consisting of 46.0% by weight of tin, 46.0% by weight of lead and 8.0% by weight of bismuth, one consisting of 94.6% by weight of tin, 3.4% by weight of silver and 2.0% by weight of lead, one consisting of 94.6% by weight of tin, 3.4% by weight of silver and 2.0% by weight of bismuth, one consisting of 98.5% by weight of tin, 1.0% by weight of silver and 0.5% by weight of copper, and one consisting of 96.5% by weight of tin and 3.5% by weight of silver. The solder powder of any of the compositions has a melting point within a range from about 170° C. to about 250° C.

Figure 5A:
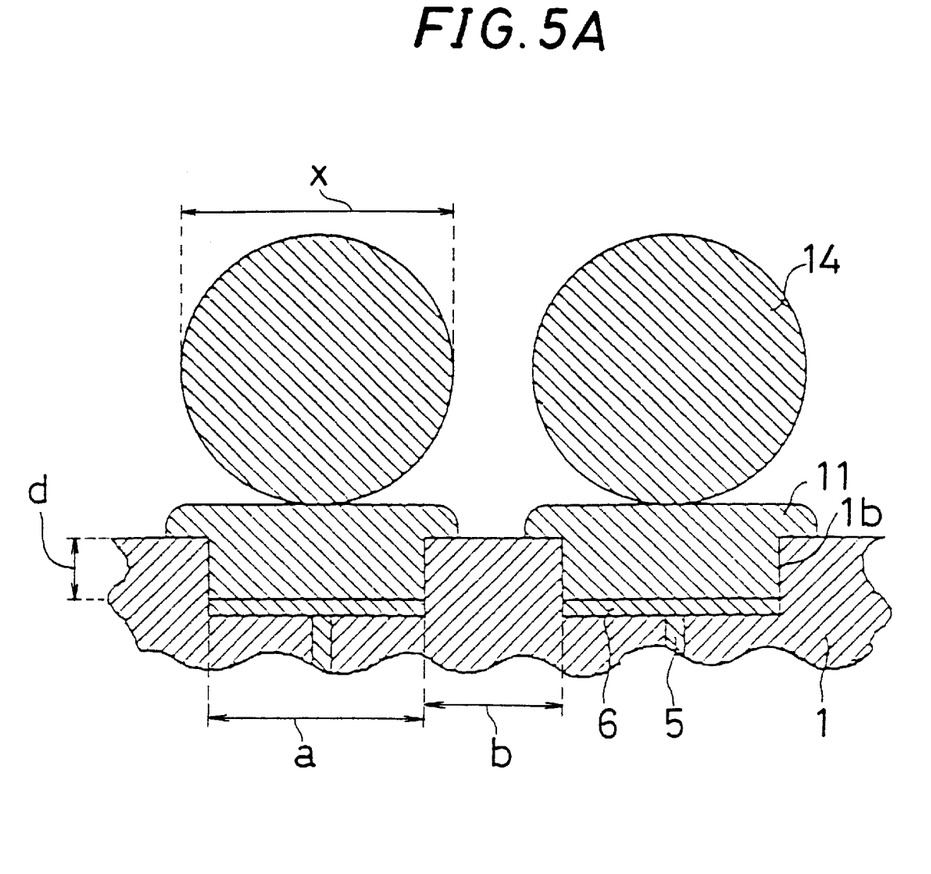
FIG. 5A and FIG. 5B are cross-sectional views illustrative of the third step of the method of fabricating a package for housing a semiconductor element according to the invention.

When solder balls 14 are placed on the depressions 1b of the insulating substrate 1, as described later, the solder paste 11 applied inside the depressions 1b of the insulating substrate 1 positions the solder balls 14 and concurrently forms connection terminals 8 with spherical protrusions 8a of a predetermined size together with the solder balls 14. By setting the height (h) of the surface of the solder paste 11 from the underside of the insulating substrate 1 to a predetermined value, the solder paste 11 is brought into intimate contact with the solder balls 14, and the tackiness of the flux which is contained in the solder paste 11 serves to temporarily fix the solder balls 14 on the depressions 1b of the insulating substrate 1.

Here, in cases where the height (h) of the protrusions from the underside of the insulating substrate 1 is less than about 100 $\mu$m, the solder paste 11 applied inside the depressions 1b on the insulating substrate 1 cannot securely join the solder balls 14 temporarily due to insufficient adhesive strength when the solder balls 14 are attempted to be properly located on the solder paste 11 by the tackiness of the flux in the solder paste 11, whereas when the height of the protrusions exceeds about 200 $\mu$m, part of the solder paste 11 spreads across the underside of the insulating substrate 1, and increases the risk of contact between the solder paste 11 applied inside the adjacent depressions 1b. Accordingly, the solder paste 11 applied inside the depressions 1b on the insulating substrate 1 preferably is such that the height of the protrusions from the underside of the insulating substrate 1 are within the range of about 100–200 $\mu$m.

On the other hand, when the average particle size of the solder powder exceeds about 50 $\mu$m, the fluidity of the solder paste 11 is impaired, and it is difficult to apply the solder paste 11 inside the depressions 1b of the insulating substrate 1. Therefore, the average particle size of the solder powder of the solder paste 11 is desirable to be about 50 $\mu$m or less.

Further, in cases where the proportion of the flux in the solder paste 11 is less than about 8% by weight, the viscosity of the solder paste 11 reaches about 350,000 centipoises or higher, and it is difficult to apply the solder paste 11 inside the depressions 1b, whereas the viscosity of the solder paste 11 lowers to about 150,000 centipoises or lower when the proportion exceeds about 10% by weight, and part of the solder paste 11 applied inside the depressions 1b of the insulating substrate 1 greatly extends across the underside of the insulating substrate 1, and this causes the solder paste 11 applied inside the neighboring depressions 1b to be brought into contact with each other. Accordingly, the proportion of the flux in the solder paste 11 preferably is within a range of from about 8 to about 10% by weight in order to maintain the viscosity of the solder paste 11 on the order of about 150,000 to about 350,000 centipoises.

Then, as illustrated in FIG. 5A, in the third step, the solder balls 14 are mounted on the surface of the solder paste 11 applied inside the depressions 1b on the underside of the insulating substrate 1, to temporarily fix the solder balls 14 on the solder paste 11 by the tackiness of the flux which is contained in the solder paste 11.

Figure 5B:
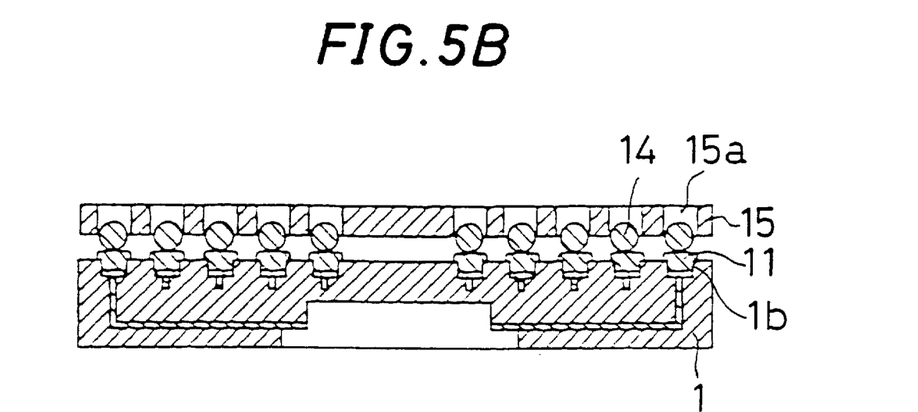

The solder balls 14 are mounted on the surface of the solder paste 11 by placing a metal plate (mask) 15 having holes 15a located at positions corresponding to the depressions 1b of the insulating substrate 1, on the underside (upper surface in the drawing) of the insulating substrate 1 to which the solder paste 11 has been applied, as illustrated in FIG. 5B, and then inserting the solder balls 14 into the corresponding holes 15a of the metal plate 15, respectively.

Since the solder balls 14 are desirable to have substantially the same melting point as the solder powder of the solder paste 11, solder powder of the same composition as of the solder powder of the solder paste 11 is preferably used to prepare the solder balls 14. Of course, not only solder of the same composition, but also any solder of different composition may be used provided that substantially the same melting point is obtained.

Here, the solder balls 14 are prepared as follows. Specifically, an alloy of a desired solder composition is fused in a crucible to an ingot which is processed into a rod. The rod is fused and dropped into oil through a nozzle, and then cooled to ball-shaped solids. The ball-shaped solids are sieved to obtain solder balls 14 of a desired diameter.

Figure 6:
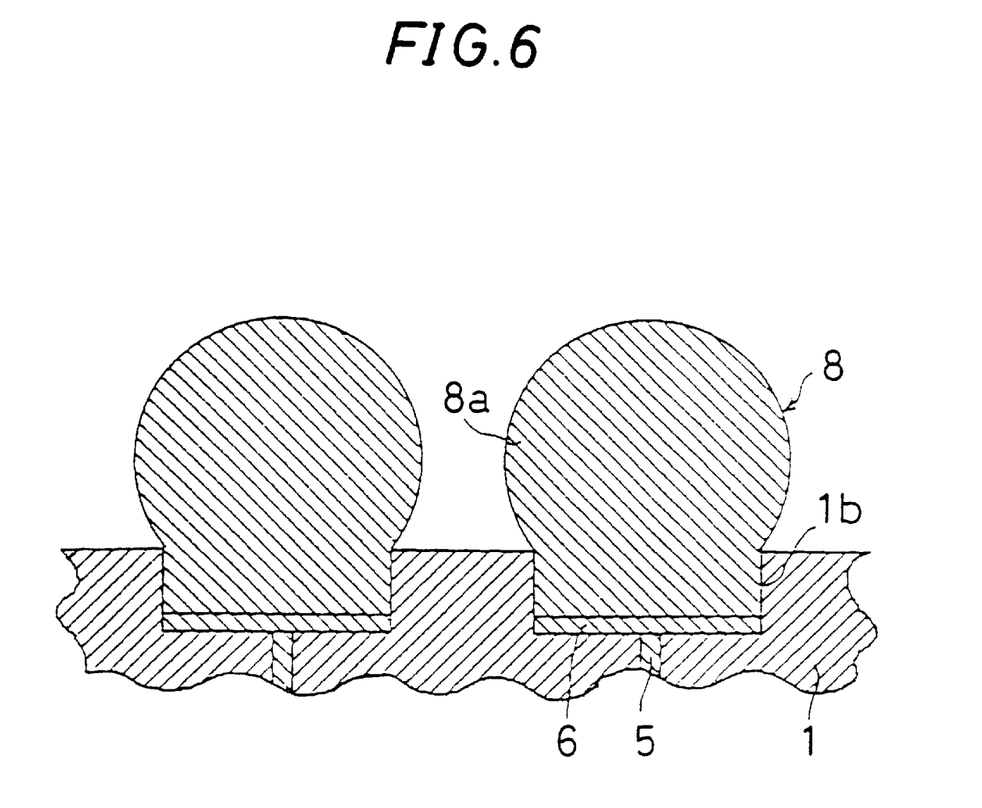
FIG. 6 is a cross-sectional view illustrative of the fourth step of the method of fabricating a package for housing a semiconductor element according to the invention.

Finally, in the fourth step, both the solder paste 11 and the solder balls 14 are heated in an atmosphere of nitrogen which has an oxygen content of 500 ppm or lower and is at a temperature of from about 200 to about 300° C. to vaporize the flux in the solder paste 11 and concurrently to fuse the solder powder and the solder balls 14 into one-piece structures. This results in the formation of the connection terminals 8 on the underside of the insulating substrate 1 which have spherical protrusions 8a, thus completing a package for housing a semiconductor element.

Here, the formation of the spherical protrusions 8a of the connection terminals 8 on the underside of the insulating substrate 1 is accomplished by the action of the surface tension which is produced when the solder powder of the solder paste 11 and the solder balls 14 are fused into the one-piece structures.

The connection terminals 8 are formed by fusing the solder powder of the solder paste 11 and the solder balls 14 into the one-piece structures, since the following problems occur in cases where only the solder balls 14 are used to form the connection terminals 8.

Specifically, in cases where the diameter (x) of the solder balls 14 is smaller than the diameter (a) of the depressions 1b provided on the underside (upper surface in the drawing) of the insulating substrate 1, the solder balls 14 which are placed on the depressions 1b and fused cannot form the spherical protrusions 8a of a prescribed diameter (c) on the underside of the insulating substrate 1 for formation of the connection terminals 8, since the solder balls 14 are completely squeezed into the depressions 1b. As a result, when the electrical connection pads 6 are attempted to be joined to the wiring conductors on an external electrical circuit board by means of the connection terminals 8, since the quantity of the connection terminals 8 which protrude from the underside of the insulating substrate 1 is small, the connection terminals 8 cannot be securely joined to the wiring conductors, and this produces the problem that electrical connections cannot be securely and reliably established between the respective electrodes of the semiconductor element and the predetermined wiring conductors. On the other hand, when the diameter (x) of the solder balls 14 is larger than the diameter (a) of the depressions 1b provided on the underside of the insulating substrate 1 and the solder balls 14 are placed on the depressions 1b and fused in order to prepare the connection terminals 8, since the solder balls 14 are brought into contact with the openings of the depressions 1b and thus cannot contact the connection pads 6 formed inside the depressions 1b, the fused solder balls 14 are incompletely hard-soldered to the electrical connection pads 6, and this causes the connection pads 8 to be poorly hard-soldered to the connection pads 6. Further, it may be advisable to increase the diameter (x) of the solder balls 14 over the diameter (a) of the depressions 1b provided on the underside of the insulating substrate 1 and concurrently to decrease the depth (d) of the depressions 1b in order to form the connection terminals 8, with the solder balls 14 partially brought into contact with the electrical connection pads 6 in the depressions 1b. However, since the thermal stress which is produced due to the difference in coefficients of thermal expansion between the insulating substrate 1 and the external electrical circuit board 9 cannot be dominantly placed on the periphery of the openings of the depressions 1b when the depth (d) of the depressions 1b is decreased. As a result, the thermal stress is directly placed on the electrical connection pads 6, and the electrical connection pads 6 are peeled off from the insulating substrate 1. Therefore, in order to hard-solder to the electrical connection pads 6 the connection terminals 8 which have the spherical protrusions 8a of a prescribed diameter (c) at the side of the underside of the insulating substrate 1, without peeling off the electrical connection pads 6 placed inside the depressions 1b provided on the underside of the insulating substrate 1, the solder paste 11 may be applied inside the depressions 1b with a large depth and concurrently the solder balls 14 with a larger diameter (x) than the diameter (a) of the depressions 1b are placed on the solder paste 11 to bring the solder balls 14 into contact with the electrical connection pads 6 in the depressions 1b by means of the solder paste 11, and then the solder powder of the solder paste 11 and the solder balls 14 may be fused into one-piece structures to securely hard-solder the connection terminals 8 provided with the spherical protrusions 8a of a prescribed diameter (c) on the underside of the insulating substrate 1, to the electrical connection pads 6 in the depressions 1b.

In addition, if the diameter (x) of the solder balls 14 exceeds 85% of the total (b) of the diameter (a) of the depressions 1b and the distance (l) between the neighboring depressions 1b of the insulating substrate 1, it is easy for a contact short-circuit to occur between the protrusions 8a of the neighboring connection terminals 8. Accordingly, the diameter of the solder balls 14 preferably is larger than the diameter (a) of the depressions 1b of the insulating substrate 1, but 85% or less of the total (b) of the diameter of the depressions 1b and the distance between the neighboring depressions 1b of the insulating substrate 1.

In the method of fabricating a package for housing a semiconductor element according to the invention, since a plurality of depressions are provided on at least one principal surface of the insulating substrate and the connection pads are hard-soldered to the electrical connection pads formed inside the depressions, the thermal stress which is produced between the insulating substrate and the external electrical circuit board is placed on the periphery of the openings of the depressions provided on the insulating substrate, and thus no great thermal stress cannot be directly put on the electrical connection pads, and accordingly the electrical connection pads are joined to the insulating substrate with a very high degree of reliability.

In addition, since the connection terminals are formed by applying solder paste inside the depressions which are provided on at least one principal surface of the insulating substrate 1 and have electrical connection pads formed therein, and mounting solder balls on the solder paste, followed by heating to fuse both the solder powder of the solder paste and the solder balls into one-piece structures, the connection terminals are reliably and securely hard-soldered to the electrical connection pads to establish electrical connections between them, and concurrently spherical protrusions of a prescribed size are formed on the one principal surface of the insulating substrate to allow the connection terminals to be securely joined to the wiring conductors on a prescribed external electrical circuit board.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of fabricating a package for housing a semiconductor element, comprising the steps of:
   (a) preparing an insulating substrate which has a plurality of depressions on at least one principal surface thereof, with an electrical connection pad formed in each of the depressions;
   (b) applying solder paste containing solder powder within the depressions in order for the surface of the solder paste to protrude from the principal surface of the insulating substrate;
   (c) mounting solder balls on the surface of the solder paste; and
   (d) fusing the solder paste and the solder balls to produce unitary structures in order to form connection terminals with spherical protrusions.

2. The method according to claim 1, wherein the solder balls have substantially the same melting point as the solder powder.

3. The method according to claim 1, wherein the solder balls have substantially the same solder composition as the solder powder.

4. The method according to claim 1, wherein diameter X of the solder balls satisfies the following equation:

$$a < X \leq 0.85b$$

where "a" represents the diameter of the depressions on the insulating substrate, and "b" represents the total of the distance between two neighboring depressions and the diameter of the depressions of the insulating substrate.

5. The method according to claim 1, wherein the solder powder is the powder of an alloy of tin as the main ingredient, and at least one metal selected from the group consisting of lead, bismuth, silver and copper.

6. The method according to claim 1, wherein the viscosity of the solder paste is in the range of from about 150,000 to about 350,000 centipoises.

7. The method according to claim 1, wherein the solder paste is formed of solder powder with an average particle size of about 50 $\mu$m or smaller which contains about 8 to about 10% by weight of a flux.

8. The method according to claim 1, wherein a depression is about 0.3 to about 1.0 mm and a depth of about 0.05 mm or greater.

9. The method according to claim 1, wherein a protrusion of the solder paste applied within the depression has a height in a range of from about 100 to about 200 $\mu$m from the principal surface of the insulating substrate.

10. The method according to claim 1, wherein the insulating substrate is made of an insulating ceramic material selected from the group consisting of aluminum oxide sintered body, mullite sintered body, silicon carbide sintered body, aluminum nitride sintered body and glass ceramic sintered body, or made of an insulating organic resin material selected from the group consisting of epoxy resin, polyimide resin, phenol resin, polyphenylene ether resin, polyimido-amide resin, bismaleimido-triazine resin and fluorine resin.

11. The method according to claim 1, wherein in step (c), a mask is prepared which is provided with a plurality of through-holes aligned with the plurality of depressions on the insulating substrate, and is placed with a distance from the surface of the solder paste in order for the through-holes to face the corresponding depressions, and the solder balls are mounted on the surface of the solder paste via the through-holes of the mask.

* * * * *